United States Patent
Leavitt et al.

(10) Patent No.: US 9,711,316 B2
(45) Date of Patent: Jul. 18, 2017

(54) METHOD OF CLEANING AN EXTRACTION ELECTRODE ASSEMBLY USING PULSED BIASING

(71) Applicant: Varian Semiconductor Equipment Associates, Inc., Gloucester, MA (US)

(72) Inventors: Christopher J. Leavitt, Gloucester, MA (US); Peter F. Kurunczi, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 791 days.

(21) Appl. No.: 14/050,764

(22) Filed: Oct. 10, 2013

(65) Prior Publication Data

US 2015/0101634 A1 Apr. 16, 2015

(51) Int. Cl.

| | |
|---|---|
| *C23C 16/00* | (2006.01) |
| *C23C 16/50* | (2006.01) |
| *C23F 1/00* | (2006.01) |
| *H01L 21/306* | (2006.01) |
| *H01J 27/02* | (2006.01) |
| *H01J 37/08* | (2006.01) |
| *H01J 37/317* | (2006.01) |
| *H01J 37/32* | (2006.01) |

(52) U.S. Cl.
CPC .......... *H01J 27/022* (2013.01); *H01J 37/08* (2013.01); *H01J 37/3171* (2013.01); *H01J 37/32862* (2013.01); *H01J 2237/022* (2013.01)

(58) Field of Classification Search
CPC .................................................... H01J 27/022
USPC .................. 118/715–733; 156/345.1–345.55
See application file for complete search history.

(56) References Cited

U.S. PATENT DOCUMENTS 5,554,854 A * 9/1996 Blake .................. H01J 37/3002
250/492.2
6,559,454 B1 * 5/2003 Murrell ................. H01J 27/022
250/423 R
(Continued)

FOREIGN PATENT DOCUMENTS

JP 2006-156259 A 6/2006

OTHER PUBLICATIONS

Lubicki, Piotr, et al., Beamline Electrode Voltage Modulation for Ion Beam Glitch Recovery, U.S. Appl. No. 13/555,910, filed Jul. 23, 2012.

(Continued)

*Primary Examiner* — Karla Moore
*Assistant Examiner* — Tiffany Nuckols
(74) *Attorney, Agent, or Firm* — Nields, Lemack & Frame, LLC

(57) ABSTRACT

A system and method of improving the performance and extending the lifetime of an ion source is disclosed. The ion source includes an ion source chamber, a suppression electrode and a ground electrode. In the processing mode, the ion source chamber may be biased to a first positive voltage, while the suppression electrode is biased to a negative voltage to attract positive ions from within the chamber through an aperture and toward the workpiece. In the cleaning mode, the ion beam is defocused so that it strikes the suppression electrode and the ground electrode. The voltages applied to the ion source chamber and the electrodes are pulsed to minimize the possibility of glitches during this cleaning mode.

7 Claims, 6 Drawing Sheets

(56) References Cited

U.S. PATENT DOCUMENTS

| | | |
|---|---|---|
| 6,812,648 B2 * | 11/2004 | Luten .................... H01J 27/143 |
| | | 250/423 R |
| 7,947,129 B2 | 5/2011 | Murata et al. |
| 2009/0314951 A1 | 12/2009 | Biloiu et al. |
| 2011/0124186 A1 | 5/2011 | Renau et al. |
| 2011/0139605 A1 * | 6/2011 | Macneil ............. C23C 14/3485 |
| | | 204/192.11 |
| 2013/0072008 A1 | 3/2013 | Perel et al. |
| 2013/0260543 A1 | 10/2013 | Koo et al. |
| 2014/0041684 A1 * | 2/2014 | Kurunczi ............. B08B 7/0021 |
| | | 134/1.1 |

OTHER PUBLICATIONS

International Search Report and Written Opinion Mailed Jan. 21, 2015 for PCT/US2014/059903 Filed Oct. 9, 2014.

* cited by examiner

METHOD OF CLEANING AN EXTRACTION ELECTRODE ASSEMBLY USING PULSED BIASING

FIELD

Present disclosure relates generally to methods of cleaning an extraction electrode assembly, particularly in an ion source, using pulsed biasing.

BACKGROUND

Ion implantation is a process by which dopants or impurities are introduced into a substrate via bombardment. In semiconductor manufacturing, the dopants are introduced to alter electrical, optical, or mechanical property. For example, dopants may be introduced into an intrinsic semiconductor substrate to alter the type and level of conductivity of the substrate. In manufacturing an integrated circuit (IC), a precise doping profile is often important for proper IC performance. To achieve a desired doping profile, one or more dopants may be implanted in the form of ions in various doses and various energy levels.

In some implementations, a plasma is created in an ion source chamber. This plasma contains positively charged dopant ions. An extraction electrode assembly may be disposed outside of and proximate the ion source chamber. This extraction electrode assembly may include at least a suppression electrode and a ground electrode. Each of the electrodes in the extraction electrode assembly may have an aperture, through which the positively charged dopant ions may pass. In addition, one or more of the electrodes may be negatively biased to attract the positively charged dopant ions through an extraction aperture in the ion source chamber and through the apertures in the extraction electrode assembly. These extracted dopant ions form an ion beam, which is then used to implant the substrate.

One cause of ion source failure is accumulation of materials on the inner wall of the ion source chamber, the suppression electrode and the ground electrode. In addition, the materials may accumulate on the apertures. If formed on the inner wall of the ion source chamber, the materials may reduce the rate by which ions are generated and reduce the beam current.

One way to prevent the effect of the material accumulation is to intermittently replace the ion source with a clean ion source. Alternatively, the ion source may have to be manually cleaned after powering down the entire ion source and after releasing the vacuum. However, these measures require the ion source or the entire ion implanter system to be powered down and to release the vacuum within the system. Moreover, the ion implanter system, after replacing or cleaning the ion source, must be powered and evacuated to reach operational condition. Accordingly, these maintenance processes may be very time consuming. In addition, the ion implanter system is not used during the maintenance processes. As such, frequent maintenance processes may decrease IC production time, while increasing its manufacturing cost and placing excessive financial burden on the manufacturers and, ultimately, the consumers. In view of the foregoing, it would be desirable to provide a new technique for improving the performance and extending the lifetime of an ion source to overcome the above-described inadequacies and shortcomings.

SUMMARY

A system and method of improving the performance and extending the lifetime of an ion source is disclosed. The ion source includes an ion source chamber, a suppression electrode and a ground electrode. In the processing mode, the ion source chamber may be biased to a first positive voltage, while the suppression electrode is biased to a negative voltage to attract positive ions from within the chamber through an aperture and toward the workpiece. In the cleaning mode, the ion beam is defocused so that it strikes the suppression electrode and the ground electrode. The voltages applied to the ion source chamber and the electrodes are pulsed to minimize the possibility of glitches during this cleaning mode.

In a first embodiment, an ion source is disclosed. The ion source comprises an ion source chamber for generation of a process plasma during a processing mode and a cleaning plasma during a cleaning mode, the ion source chamber having an extraction aperture; a suppression electrode having a suppression electrode aperture, the suppression electrode disposed proximate the extraction aperture, wherein an ion beam extracted from the extraction aperture during the cleaning mode is defocused so as to strike the suppression electrode; and a biasing system configured to periodically stop the ion beam from striking the suppression electrode during the cleaning mode and to ground the suppression electrode and the ion source chamber when the ion beam is periodically stopped.

In a second embodiment, a method of cleaning an ion source is disclosed. The ion source comprises an ion source chamber having an extraction aperture, a ground electrode, and a suppression electrode disposed between the ion source chamber and the ground electrode. The method comprises flowing a cleaning gas into the ion source chamber; generating a plasma in the ion source chamber using the cleaning gas; defocusing an ion beam extracted from the ion source chamber, such that the ion beam strikes the suppression electrode; biasing the ion source chamber and the suppression electrode to a set of cleaning bias voltages so that the defocused ion beam removes material from the suppression electrode during a cleaning time interval; grounding the ion source chamber and the suppression electrode periodically during the cleaning time interval; and repeating the biasing and grounding a plurality of times during the cleaning time interval.

In a third embodiment, a method of operating an ion source is disclosed. The ion source comprises an ion source chamber having an extraction aperture, a ground electrode, and a suppression electrode disposed between the ion source chamber and the ground electrode. The method of operating the ion source comprises flowing a source gas into the ion source chamber during a processing mode; generating a process plasma in the ion source chamber using the source gas during the processing mode; applying a set of processing bias voltages to the ion source chamber and the suppression electrode during the processing mode; extracting an ion beam through the extraction aperture during the processing mode, the ion beam configured to implant a substrate; flowing a cleaning gas into the ion source chamber during a cleaning mode; generating a cleaning plasma in the ion source chamber using the cleaning gas during the cleaning mode; defocusing an ion beam extracted from the ion source chamber, such that the defocused ion beam strikes the suppression electrode during the cleaning mode; biasing the ion source chamber and the suppression electrode to a set of cleaning bias voltages so that the defocused ion beam removes material from the suppression electrode during the cleaning mode; grounding the ion source chamber and the suppression electrode periodically during the cleaning mode to remove charge build up; and repeating the biasing and grounding a plurality of times during the cleaning mode.

BRIEF DESCRIPTION OF THE FIGURES

For a better understanding of the present disclosure, reference is made to the accompanying drawings, which are incorporated herein by reference and in which.

DETAILED DESCRIPTION

Herein, a new method of cleaning an extraction electrode assembly using pulsed biasing is disclosed. For purposes of clarity and simplicity, the present disclosure may focus on the methods as used with an ion implanter having an indirectly heated cathode (IHC) as the ion generator. Those of ordinary skill in the art will recognize that the present disclosure, however, is not limited to a particular ion generator or a particular ion implantation system. The present disclosure may be equally applicable to other types of ion generators including, for example, Bernas source or RF plasma source, in other types of ion implantation systems including, for example, multiple wafer (e.g. batch), spot beam ion implantation system or plasma based ion implantation system, with or without the beam-line components. In addition, the present disclosure may be equally applicable to other plasma based substrate processing systems or other systems that use ions.

Figure 1:
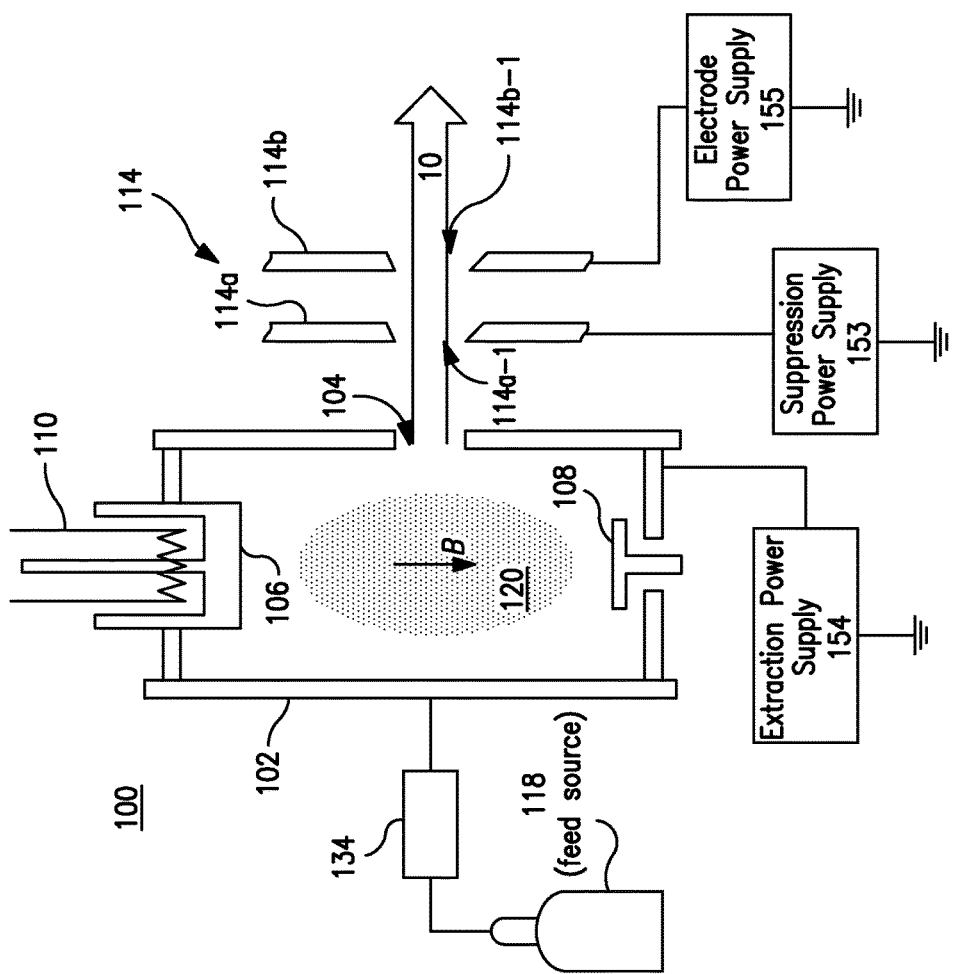
FIG. 1 is an ion source according to a first embodiment.

Referring to FIG. 1, there is shown simplified illustration of an exemplary ion source 100 according to one embodiment of the present disclosure. The ion source 100 may include an IHC, as illustrated in the figure, or other types of ion generators. The ion source 100 may include an ion source chamber 102. On the front side of the ion source chamber 102, an extraction aperture 104 may be disposed. A cathode 106 and a repeller electrode 108 (or anti-cathode) may be positioned in the opposite sides of the ion source chamber 102. A filament 110 may be positioned outside the ion source chamber 102 and in close proximity to the cathode 106 to heat the cathode 106. One or more source magnets (not shown) may also be provided to produce a magnetic field B (see arrow B) in the ion source chamber 102.

Near the ion source chamber 102, there may be one or more feed sources 118. In the present disclosure, material provided from the feed source 118 may include source gasses and cleaning gasses. The source gasses may contain dopant species that may be introduced into the substrate in the form of ions during normal operating mode. The cleaning gas may comprise a gas that is used during a cleaning mode.

In the present disclosure, various species may be used as the source gas. Examples of the source gas may include atomic or molecular species containing, boron (B), gallium (Ga), germanium (Ge), phosphorus (P), arsenic (As), and others. Examples of cleaning gas may include argon (Ar). Those of ordinary skill in the art will recognize that the above species are not exhaustive, and other atomic or molecular species may also be used.

Preferably, the source gas and/or the cleaning gas is provided into the ion source chamber 102 in gaseous or vapor form. If the source gas and/or the cleaning gas is in non-gaseous or non-vapor form, a vaporizer (not shown) may be provided near the feed source 118 to convert the material into gaseous or vapor form. To control the amount and the rate by which the source and/or the additional material is provided into the ion source chamber 102, a flowrate controller 134 may be provided.

Proximate to the ion source chamber 102, near the extraction aperture 104, an extraction electrode assembly 114 may be disposed. In the present embodiment, the extraction electrode assembly 114 may comprise a suppression electrode 114a and a ground electrode 114b. Each of the suppression electrode 114a and the ground electrode 114b may have an aperture that is in communication with the extraction aperture 104 of the ion source chamber 102. In the suppression electrode 114a, there may be a suppression electrode aperture 114a-1, whereas a ground electrode aperture 114b-1 may be disposed and defined in the ground electrode 114b. Hereinafter, the suppression electrode aperture 114a-1 and the ground electrode aperture 114b-1 may be collectively referred to as an extraction electrode aperture, which is in communication with the extraction aperture 104 of the ion source chamber 102.

In order to power the ion source chamber 102, the cathode 106, the filament 110, the repeller electrode 108, the suppression electrode 114a, and/or the ground electrode 114b, one or more power supplies may be provided. For the purpose of clarity and simplicity, only three power supplies are shown. Those of skill in the art will recognize that there may be multiple power supplies, each of which may be electrically coupled to different components of the ion source 100. Or, there may be multiple power supplies where one of the power supplies may be electrically coupled to multiple components. In yet another embodiment, a single power supply, having a plurality of outputs may be used to power all of the components in the system 100. In the present disclosure, the power supplies 153, 154, 155 may provide continuous or pulsed, alternating current (AC) or direct current (DC). The power supplies 153, 154, 155 may also provide positive or negative bias voltage.

The ground electrode 114b may be biased by a ground electrode power supply 155. In some embodiments, the ground electrode 114b is grounded, thereby obviating the need for the ground electrode power supply 155. The suppression electrode 114a may be powered by a suppression power supply 153. An extraction power supply 154 is used to bias the walls of the ion source chamber 102. In some embodiments, the suppression power supply 153 and/or the extraction power supply 154 may be referenced to the ground electrode 114b.

As noted above, one cause of the ion source 100 failure may be excessive accumulation of materials during its extended use. For example, materials may accumulate on the walls of, among others, the ion source chamber 102, the suppression electrode 114a, and the ground electrode 114b. To prevent excessive accumulation, the ion source 100 of the present embodiment may operate in two modes: processing mode and cleaning mode. During the processing mode, the ion source 100 may generate dopant ions, which are implanted in a substrate disposed downstream of the ion beam 10. During the cleaning mode, the ion source 100 may be in situ cleaned. In the present disclosure, the ion source 100 may operate in the processing mode and cleaning mode.

During the processing mode, the source gas containing dopant species may be introduced into the ion source chamber 102 from the feed source 118. Meanwhile, the filament 110 may be powered to emit electrons toward the cathode 106 via thermionic emission. The cathode 106, in turn, may emit electrons in the ion source chamber 102 to generate a plasma 120 containing, among others, dopant ions.

The ground electrode 114b may be biased by the ground electrode power supply 155 so as to extract the ions 10 from the ion source chamber 102. In some embodiments, the ground electrode 114b may be grounded and is not in communication with a power supply. Such ions 10 may be directed toward the substrate. In one embodiment, the suppression power supply 153 may provide +/−bias voltage and continuous/pulsed, AC/DC to the suppression electrode 114a. In one particular embodiment, the suppression power supply 153 may supply about −2 kV to −30 kV at about 100 mA to the suppression electrode 114a. The extraction power supply 154 may supply between about 10 kV and 70 kV to the walls of the ion source chamber 102. The extraction power supply 154 may be able to supply between 25 mA and up to about 200 mA of current.

In the processing mode, the ions may be extracted from the ion source chamber 102 as a focused ion beam 10. It will be understood that the voltage and current noted above are given by way of example only and are not limiting as to the scope of present disclosure. Also, it will be understood that the voltage and current provided by the power supplies 153, 154, 155 may be constant or varied.

Figure 2:
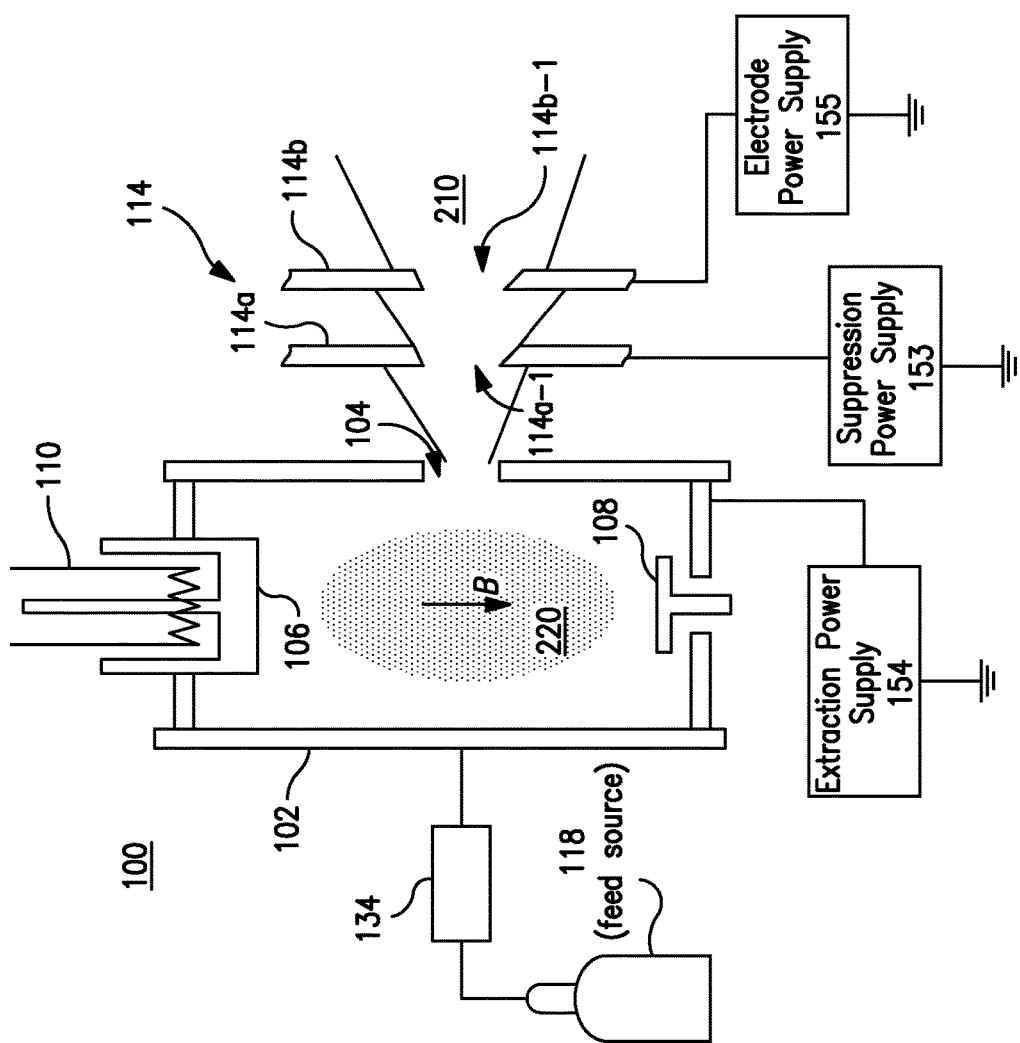
FIG. 2 shows the ion source of FIG. 1 operating in cleaning mode.

Referring to FIG. 2, there is shown the ion source 100 operating under the cleaning mode, according to one embodiment of the present disclosure. It should be appreciated that most of the components illustrated in FIG. 1 are incorporated into FIG. 2. As such, most of the components in FIG. 2 should be understood in relation to the components in FIG. 1.

During the cleaning mode, ion source 100 may be in situ cleaned. In the present embodiment, the cleaning gas may be introduced into the ion source chamber 102. As described above, various species may be introduced as the cleaning gas.

As is done in the processing mode, a cleaning plasma 220 is created in the ion source chamber 102. Unlike the plasma 120 created in processing mode, however, this cleaning plasma 220 may not contain dopants. Rather, the cleaning gas may be selected based on its effectiveness to sputter onto the extraction electrode assembly 114 and remove material therefrom.

In addition, in cleaning mode, the ion beam 210 is defocused. This defocusing may be accomplished in a number of ways. In one embodiment, the distance between the extraction electrode assembly 114 and the extraction aperture 104 is varied. In one embodiment, the distance between these components is increased. In another embodiment, defocusing is accomplished by modifying the bias voltages applied to the walls of the ion source chamber 102, the suppression electrode 114a and/or the ground electrode 114b. For example, in one example, the walls of the ion source chamber 102 are biased at about 5 kV, the suppression electrode 114a is biased at −7 kV and the ground electrode 114b is grounded. In other embodiments, defocusing is accomplished by a combination of these techniques, whereby the distance between the extraction aperture 104 and the extraction electrode assembly 114 is modified, and the bias voltages applied to at least one of the walls of the ion source chamber 102, the suppression electrode 114a and the ground electrode 114b is also modified.

As illustrated in FIG. 2, the defocusing of the ion beam 210 causes ions to strike the extraction electrode assembly 114, and particularly the suppression electrode 114a and the ground electrode 114b. Energetic ions striking these surfaces may serve to remove material that has built up on the extraction electrode assembly 114 during the processing mode.

However, in some cases, the sustained striking of the extraction electrode assembly 114 by the energetic ions may result in arcs between two adjacent components. For example, arcs may be created between the wall of the ion source chamber 102 and the suppression electrode 114a, as these components are biased at different voltages. Likewise, arcs may be created between the suppression electrode 114a and the ground electrode 114b.

Thus, according to one embodiment, the bias voltages being applied to each of the walls of the ion source chamber 102, the suppression electrode 114a and the ground electrode 114b are all disabled and each of these components is connected directly to ground. This direct connection to ground serves to eliminate any electrostatic energy that has accumulated on the surfaces of these components and to allow any arcs that may have been created to dissipate. After the components have been grounded for a sufficient amount of time, the respective bias voltages are restored to each component.

For example, the cleaning mode may begin by optionally moving the extraction electrode assembly 114 and modifying the bias voltages applied to the walls of the ion source chamber 102, the suppression electrode 114a and/or the ground electrode 114b. After a first time duration, the walls of the ion source chamber 102, the suppression electrode 114a and the ground electrode 114b are all grounded. This removes any charge that may build up on the surfaces of these components. After a second time duration, the bias voltages are restored to each of these components. This sequence may be repeated for the entirety of the cleaning mode. The pulsed bias voltage duty cycle, defined as the duration of time where the bias voltages are being applied divided by the total elapsed time, may vary. In some embodiments, the duty cycle may be between 1-80%. In some embodiments, the duty cycle may be less than 50%. In some other embodiments, the duty cycle may be 10-25%.

Figure 3B:
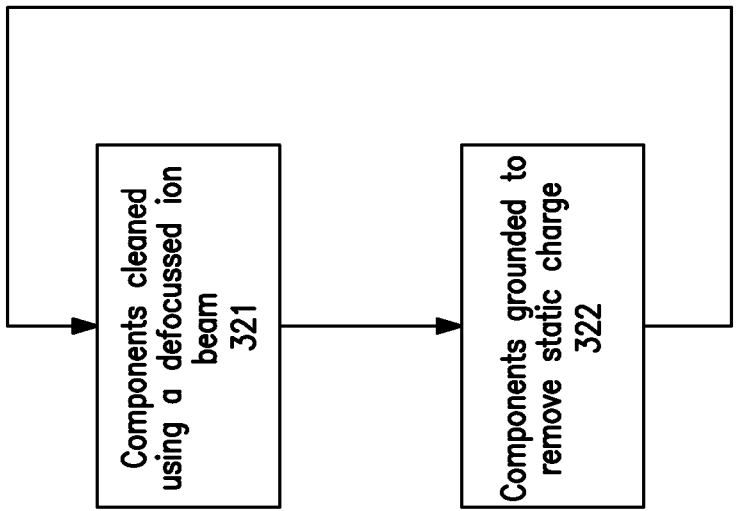
FIG. 3A-3B show flowcharts illustrating operation of the ion source.
Figure 3A:
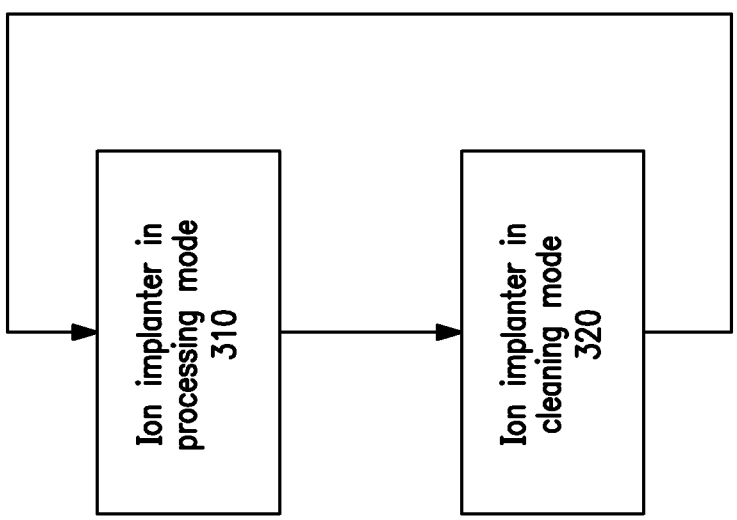

Thus, an ion source may be operated as shown in FIG. 3A. First, the ion source is operated in processing mode (see Box 310) for a first operating time period. In some embodiments, this first operating time period may be between 20-50 hours, or more particularly between 40-50 hours. During this time, the walls of the ion source chamber 102, the suppression electrode 114a and the ground electrode 114b are respectively biased to a set of processing bias voltages. A source gas is used to generate the plasma 120 used for the ion beam.

After this first operating time period, cleaning mode (see Box 320) is entered for a second operating time period. This second operating time period is much shorter than the first operating time period, for example less than 1 hour. In some embodiments, the second operating time period may be less than 30 minutes, such as about 20 minutes. As described above, cleaning mode involves several modifications to the operating parameters used in processing mode. For example, the source gas used to create the plasma is replaced with a cleaning gas. In addition, the ion beam is defocused, either by a change in spacing between the extraction aperture 104 and the extraction electrode assembly 114, a change in bias voltages of the various components, or a combination of these two actions.

This cycle of processing mode and cleaning mode can be repeated indefinitely, or until the ion source is taken off-line for preventative maintenance.

FIG. 3B shows the operation of the ion source during the cleaning mode. First, as shown in Box 321, a defocused ion beam is generated to clean the extraction electrode assembly 114. The walls of the ion source chamber 102, the suppression electrode 114a and the ground electrode 114b are respectively biased to a set of cleaning voltages. During this first cleaning time period, the defocused ion beam serves to remove built up material from the extraction electrode assembly 114. After the first cleaning time period, the walls of the ion source chamber 102, the suppression electrode 114a and the ground electrode 114b are all directly connected to ground for a second cleaning time period, as shown in Box 322. This step serves to removal any charge that has built up on these components. This sequence of cleaning steps 321, 322 is repeated while the ion source is in cleaning mode. In one embodiment, this sequence of cleaning steps is executed at a frequency of about 1 kHz, although other frequencies are within the scope of the disclosure. As described above, the duty cycle (i.e. first cleaning time period divided by the sum of the first cleaning period and the second cleaning period) may be less than 50% in some embodiments. In some embodiments, this duty cycle may be between 10-25%. In other embodiments, the duty cycle may be between 1-80%.

Figure 4:
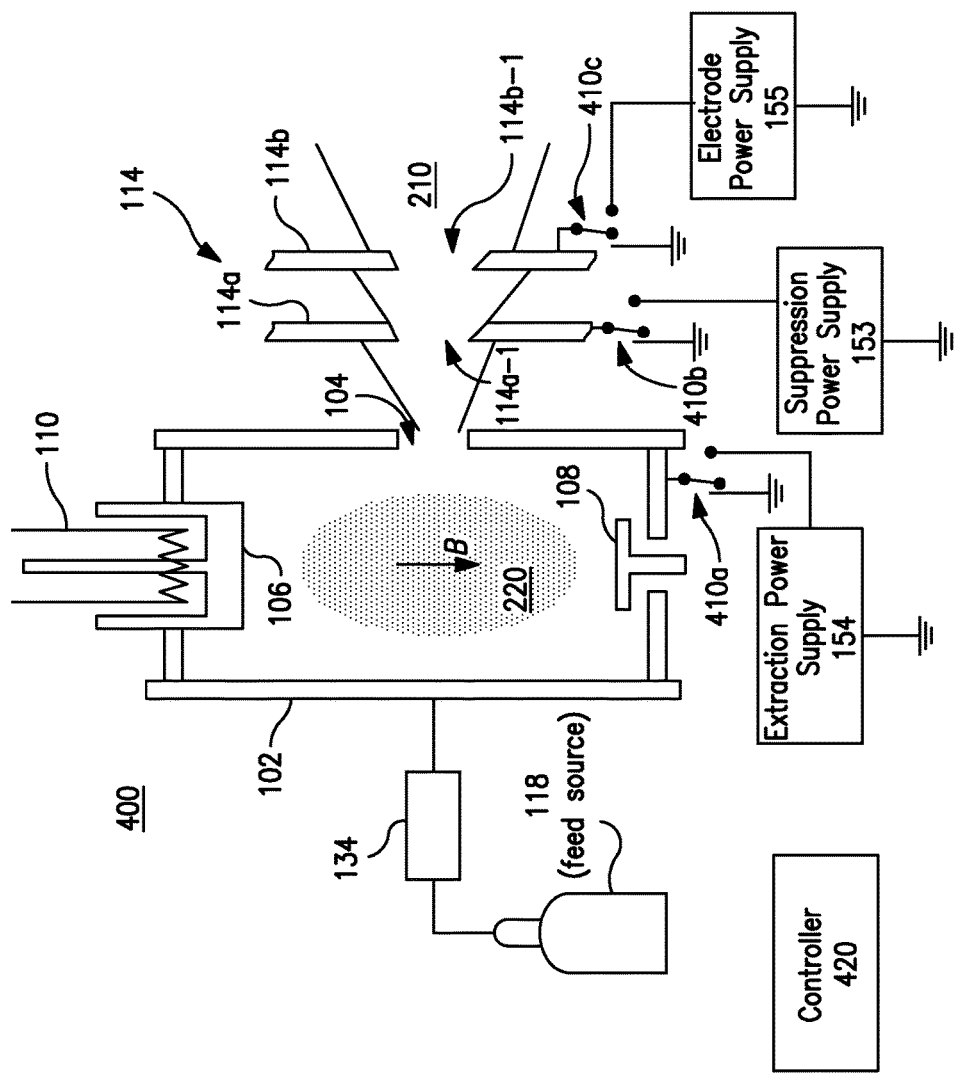
FIG. 4 shows an ion source according to a second embodiment.

Various embodiments may be employed to create the ion source described herein. FIG. 4 shows a first embodiment of an ion source 400. In this embodiment, each of the walls of the ion source chamber 102, the suppression electrode 114a and the ground electrode 114b are in communication with a respective switching device 410a-c. One terminal of each respective switching device 410a-c is in communication with the associated power supply 153, 154, 155. Another terminal of each switching device 410a-c is directly connected to ground. Thus, when the switching devices 410a-c are in a first position, the components are each biased to a respective bias voltage, as determined by the respective power supply. When the switching devices 410a-c are in a second position, each of these components is grounded.

Each of the power supplies 153, 154, 155 may be a variable or programmable power supply, capable of switching between 2 or more different output voltages. In one embodiment, the power supplies 153, 154, 155 are each in communication with a controller 420. The controller 420 includes a processing unit and a memory device. The memory device contains instructions that allow the controller 420 to perform the steps and functions described herein.

For example, this controller provides an output to each of the power supplies 153, 154, 155, instructing them to switching between processing mode and cleaning mode. Thus, the power supplies 153, 154, 155 may be instructed to switch between a set of processing bias voltages and a set of cleaning bias voltages. In addition, the controller 420 may be in communication with the switching devices 410a-c. The controller 420 provides an output to the switching devices 410a-c instructing them to switch between the terminal connected to the associated power supply and the terminal connected to ground.

The controller 420 may also be in communication with the flow rate controllers, so as to select the gas that is supplied to the ion source chamber 102. For example, the controller 420 may select the source gas during processing mode and the cleaning gas during the cleaning mode. In one embodiment, the controller 420 may also be in communication with an actuator (not shown), which is used to move the position of the extraction electrode assembly 114 relative to the ion source chamber 102. Thus, the controller 420 may be used to implement the steps illustrated in flowcharts shown in FIGS. 3A and 3B.

In a further embodiment, the controller 420 may be in communication with one or more glitch detectors (not shown). These glitch detectors may monitor the bias voltage at each component, or may monitor the current being provided by each respective power supply 153, 154, 155. The glitch detectors may be discrete components, or may be integrated into the respective power supplies. If the bias voltage drops below a certain threshold (or the current increases above a certain threshold), a glitch detector may determine that a glitch has occurred. This information is input to the controller 420. The controller 420 may then instruct the switching devices 410a-c to switch so as to ground the walls of the ion source chamber 102, the suppression electrode 114a and the ground electrode 114b. By doing this, the glitch may be eliminated more quickly, thereby preventing shutdown of the affected power supply. In some embodiments, the glitch detection and remediation technique is only performed in processing mode.

In a different embodiment, cleaning mode is performed by only moving the extraction electrode assembly 114 relative to the ion source chamber 102. In this embodiment, the power supplies 153, 154, 155 may not be programmable, and simply output a constant voltage during both modes. In this embodiment, the extraction electrode assembly 114 is moved relative to the ion source chamber 102 during the cleaning mode. As described above, the controller 420 interacts with the switching devices 410a-c to pulse the bias voltages to the components during the cleaning mode.

Figure 5:
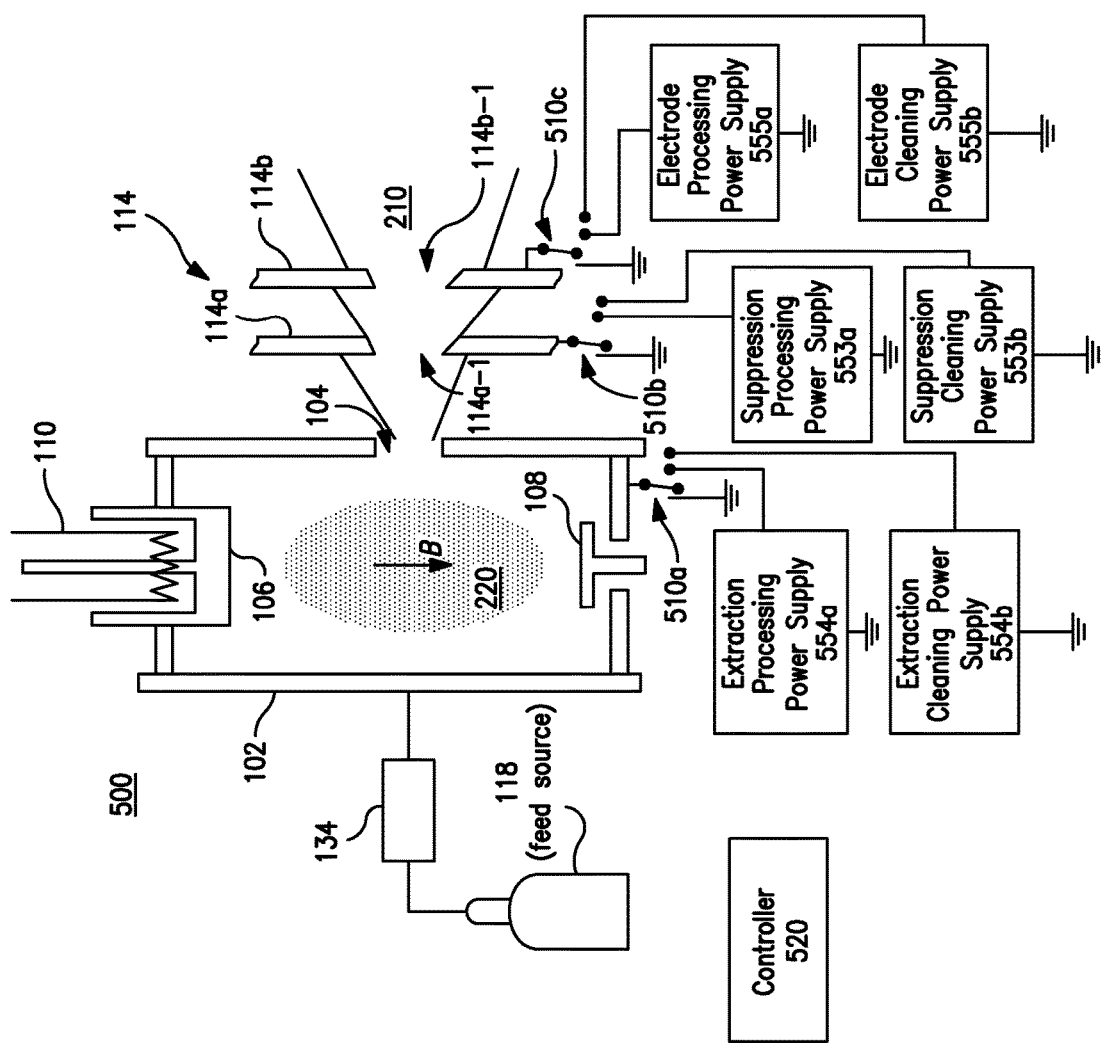
FIG. 5 shows an ion source according to a third embodiment.

In another embodiment, the programmable power supplies 153, 154, 155 are replaced by separate processing power supplies and cleaning power supplies, as illustrated in the ion source 500 of FIG. 5. For example, switching device 510a may have three terminals, one in communication with an extraction processing power supply 554a, a second in communication with an extraction cleaning power supply 554b and a third in communication with ground. Any of these three terminals can be selected so as to be in communication with the walls of the ion source chamber 102.

Similarly, switching device 510b may have three terminals, one in communication with a suppression processing power supply 553a, a second in communication with a suppression cleaning power supply 553b and a third in communication with ground. Any of these three terminals can be selected so as to be in communication with the suppression electrode 114a.

Switching device 510c may have three terminals, one in communication with a ground electrode processing power supply 555a, a second in communication with a ground electrode cleaning power supply 555b and a third in communication with ground. Any of these three terminals can be selected so as to be in communication with the ground electrode 114b. As described above, in some embodiments, the ground electrode 114b may be permanently connected to ground, thereby eliminating the needs for the switching device 510c, the ground electrode processing power supply 555a and the ground electrode cleaning power supply 555b.

In this embodiment, the controller 520 is in communication with the switching devices 510a-c and instructs these switching devices to select one of the three terminals, based on the operating mode of the ion source 500. In the first position, the switching devices 510*a-c* connect the components to a respective processing power supply 553*a*, 554*a*, 555*a*. In a second position, the switching devices 510*a-c* connect the components to a respective cleaning power supply 553*b*, 554*b*, 555*b*. In the third position, the switching devices 510*a-c* connect each of the components to ground. In addition, as described earlier, glitch detectors (not shown) may be utilized to detect glitches that occur during processing mode. In the event of a glitch, the controller 520 may instruct the switching devices 510*a-c* to switch to the third position, thereby grounding the components to remove the glitch.

As described above, the controller 520 may also be in communication with flow rate controllers, so as to select the gas that is fed into the ion source chamber 102. In addition, the controller 520 may be in communication with an actuator which moves the extraction electrode assembly 114 relative to the ion source chamber 102.

Figure 6:
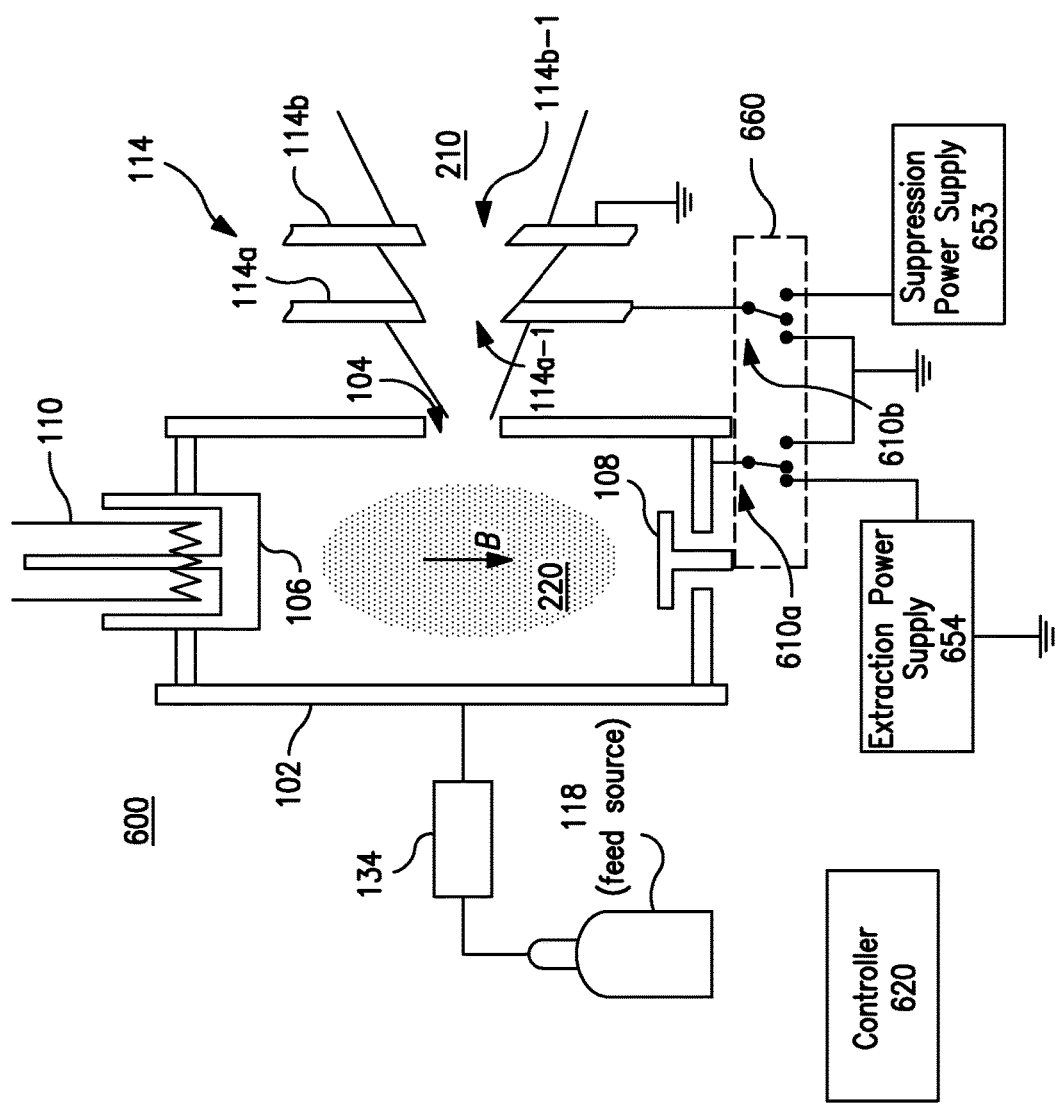
FIG. 6 shows an ion source according to a fourth embodiment.

FIG. 6 shows another embodiment of an ion source 600. In this embodiment, the ground electrode 114*b* is tied to ground. In addition, the switching devices 610*a-b* are disposed within a modulator 660. This modulator is in communication with the controller 620, such that, based on an output from the controller 620, the switching devices 610*a-b* in the modulator 660, will either both select the respective power supply 653, 654, in a first position, or the ground connection in a second position.

As described earlier, the controller 620 may also be in communication with flow rate controllers to select the gas which enters the ion source chamber 102. Additionally, the controller 620 may also be in communication with an actuator (not shown), used to move the extraction electrode assembly 114 relative to the ion source chamber 102.

Optionally, glitch detectors may be employed to detect the presence of a glitch during processing mode. As described above, this can be achieved by either monitoring the current or voltage output from each respective power supply 653, 654. The glitch detectors may be integrated into the respective power supplies 653, 654, or may be separate devices. The controller 620 may receive inputs from these glitch detectors, and instruct the modulator 660 to switch the switching devices 610*a-b* to the second position (i.e. the ground connection) if a glitch is detected. The switching devices 610*a-b* in the modulator 660 revert to the first position when the glitch is eliminated.

In each of the embodiments shown in FIGS. 4-6, the extraction power supplies, suppression power supplies, switching devices and modulators constitute a biasing system. Specifically, in FIG. 4, the biasing system may include the extraction power supply 154, the suppression power supply 153, the electrode power supply 155, switching devices 410*a-c* and controller 420. In FIG. 5, the biasing system may include the extraction processing power supply 554*a*, the extraction cleaning power supply 554*b*, the suppression processing power supply 553*a*, the suppression cleaning power supply 553*b*, the electrode processing power supply 555*a*, the electrode cleaning power supply 555*b*, the switching devices 510*a-c* and the controller 520. In FIG. 6, the biasing system may include the extraction power supply 654, the suppression power supply 653, the modulator 660, the switching devices 610*a-b* and the controller 620. In each of these configurations, the biasing system is configured to periodically stop the ion beam from striking the suppression electrode 114*a* during the cleaning mode. When the ion beam 210 is stopped, the biasing system is configured to ground the suppression electrode 114*a* and the ion source chamber 102 to remove any charge built up on these components. Furthermore, in embodiments that also include a glitch detector, the biasing system may be used to temporarily stop the ion beam during the processing mode to remove the detected glitch. This may be done by grounding the ion source chamber 102 and suppression electrode 114*a*, so as to remove the charge build up, as is done during the cleaning mode.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
   an ion source chamber for generation of a process plasma during a processing mode and a cleaning plasma during a cleaning mode, said ion source chamber having an extraction aperture;
   an extraction power supply configured to supply a first extraction voltage and current during said processing mode;
   a suppression electrode having a suppression electrode aperture, said suppression electrode disposed outside the ion source chamber and proximate said extraction aperture, wherein an ion beam extracted from said extraction aperture during said cleaning mode is defocused so as to strike said suppression electrode to remove material that has built up on said suppression electrode during the processing mode;
   a suppression power supply configured to supply a first suppression voltage and current during said processing mode; and
   a biasing system comprising the extraction power supply, the suppression power supply, and a controller configured to periodically stop said ion beam from being extracted from the ion source chamber and striking said suppression electrode during said cleaning mode and to ground said suppression electrode and said ion source chamber when said ion beam is periodically stopped to eliminate electrostatic energy that has accumulated on said suppression electrode during said cleaning mode.

2. The ion source of claim 1, comprising a glitch detector, wherein, in said processing mode, said biasing system grounds said suppression electrode and said ion source chamber when a glitch is detected.

3. The ion source of claim 1, wherein a source gas is used to generate said process plasma in said processing mode, and a cleaning gas, different than said source gas, is used to generate said cleaning plasma in said cleaning mode.

4. The ion source of claim 1, wherein said ion beam is defocused by modifying a distance between said suppression electrode and said ion source chamber.

5. The ion source of claim 1, wherein said biasing system comprises:

a first switching device in communication with said extraction power supply and said ion source chamber, wherein in a first position, said extraction power supply is electrically coupled to said ion source chamber, and in a second position, said ion source chamber is coupled to ground; and a second switching device in communication with said suppression power supply and said suppression electrode, wherein in a first position, said suppression power supply is electrically coupled to said suppression electrode, and in a second position, said suppression electrode is coupled to ground;

wherein, during said cleaning mode, said first switching device and said second switching device alternate between said first position, where said ion beam strikes said suppression electrode, and said second position, where said ion beam is temporarily stopped and said suppression electrode and said ion source chamber are grounded.

6. The ion source of claim 5, wherein said ion beam is defocused by providing a second extraction voltage different than said first extraction voltage and a second suppression voltage different than said first suppression voltage during said cleaning mode.

7. The ion source of claim 5, further comprising a glitch detector, wherein, in said processing mode, said first switching device and said second switching device each select said second position if a glitch is detected.

* * * * *